(12) United States Patent
Lin (10) Patent No.: US 11,619,799 B2
(45) Date of Patent: Apr. 4, 2023

(54) VOICE COIL MOTOR

(71) Applicant: TDK TAIWAN CORP., Taoyuan (TW)

(72) Inventor: Yi-Chieh Lin, Taoyuan (TW)

(73) Assignee: TDK TAIWAN CORP., Taoyuan (TW)

( * ) Notice: Subject to any disclaimer, the term of this patent is extended or adjusted under 35 U.S.C. 154(b) by 0 days.

(21) Appl. No.: 17/459,188

(22) Filed: Aug. 27, 2021

(65) Prior Publication Data

US 2022/0070339 A1 Mar. 3, 2022

Related U.S. Application Data

(60) Provisional application No. 63/071,550, filed on Aug. 28, 2020.

(51) Int. Cl.
| | |
|---|---|
| *H04N 5/225* | (2006.01) |
| *H02K 11/21* | (2016.01) |
| *G02B 7/04* | (2021.01) |
| *G03B 5/02* | (2021.01) |
| *G02B 7/02* | (2021.01) |
| *G02B 27/64* | (2006.01) |
| *G02B 13/00* | (2006.01) |

(Continued)

(52) U.S. Cl.
CPC ............ *G02B 7/04* (2013.01); *G01L 1/16* (2013.01); *G02B 7/003* (2013.01); *G02B 7/02* (2013.01); *G02B 7/09* (2013.01); *G02B 13/001* (2013.01); *G02B 26/0875* (2013.01); *G02B 27/0006* (2013.01); *G02B 27/646* (2013.01); *G03B 5/00* (2013.01); *G03B 5/02* (2013.01); *G03B 17/12* (2013.01); *G06F 3/016* (2013.01); *H01L 41/1132* (2013.01); *H02K 11/21* (2016.01); *H02K 41/0354* (2013.01); *H03K 17/964* (2013.01); *H04N 5/2253* (2013.01); *H04N 5/2254* (2013.01); *H04N 5/2328* (2013.01); *G03B 2205/0069* (2013.01); *H02K 41/0356* (2013.01); *H03K 2217/96062* (2013.01)

(58) Field of Classification Search
CPC . G02B 7/04; G02B 7/003; G02B 7/02; G02B 7/09; G02B 13/001; G02B 26/0875; G02B 27/0006; G02B 27/646; G02B 7/021; G01L 1/16; G03B 5/00; G03B 5/02; G03B 17/12; G03B 2205/0069; G03B 3/10; G03B 30/00; G03B 13/36; G06F 3/016; H01L 41/1132; H01L 43/08; H02K 11/21; H02K 41/0354; H02K 41/0356; H03K 17/964; H03K 2217/96062; H03K 17/9517; H04N 5/2253; H04N 5/2254; H04N 5/2328
See application file for complete search history.

(56) References Cited

U.S. PATENT DOCUMENTS

| | | | | |
|---|---|---|---|---|
| 2018/0372988 | A1* | 12/2018 | Hu | ............ H02K 41/0356 |
| 2019/0116317 | A1* | 4/2019 | Hu | ............ H04N 5/23287 |
| 2019/0181726 | A1* | 6/2019 | Kuo | ............ G03B 5/02 |

\* cited by examiner

*Primary Examiner* — Padma Haliyur
(74) *Attorney, Agent, or Firm* — Muncy, Geissler, Olds & Lowe, P.C.

(57) ABSTRACT

A driving mechanism for moving an optical element is provided, including a first fixed part, a second fixed part, a movable part, and a driving unit. The movable part is movably connected to the first and second fixed parts for holding the optical element, wherein the optical element has an optical axis. The driving unit drives the movable part to move along the optical axis relative to the first and second fixed parts.

19 Claims, 9 Drawing Sheets

(51) Int. Cl.
*G02B 26/08* (2006.01)
*H04N 5/232* (2006.01)
*G02B 7/00* (2021.01)
*G01L 1/16* (2006.01)
*G06F 3/01* (2006.01)
*H01L 41/113* (2006.01)
*H03K 17/96* (2006.01)
*G03B 5/00* (2021.01)
*G03B 17/12* (2021.01)
*H02K 41/035* (2006.01)
*G02B 7/09* (2021.01)
*G02B 27/00* (2006.01)

VOICE COIL MOTOR

CROSS REFERENCE TO RELATED APPLICATIONS

This application claims priority of provisional U.S. Patent Application Ser. No. 63/071,550, filed on Aug. 28, 2020, the entirety of which is incorporated by reference herein.

BACKGROUND OF THE INVENTION

Field of the Invention

The application relates in general to a driving mechanism, and in particular, to a driving mechanism used to move an optical element.

Description of the Related Art

As technology has advanced, a lot of electronic devices (for example, laptop computers and smartphones) have incorporated the functionality of taking photographs and recording video. These electronic devices have become more commonplace, and have been developed to be more convenient and thin. More and more options are provided for users to choose from.

In some electronic devices, several coils and magnets are usually used for adjusting the focus of a lens. However, miniaturization of the electronic devices may increase the difficulty of mechanical design, and it may also lead to low reliability and a low driving force for moving the lens. Therefore, addressing the aforementioned problems has become a challenge.

BRIEF SUMMARY OF INVENTION

In view of the aforementioned problems, the object of the invention is to provide a driving mechanism for moving an optical element. The driving mechanism includes a first fixed part, a second fixed part, a movable part, and a driving unit. The second fixed part is connected to the first fixed part. The movable part is movably connected to the first and second fixed parts for holding the optical element, wherein the optical element has an optical axis. The driving unit drives the movable part to move along the optical axis relative to the first and second fixed parts.

In some embodiments, the driving unit includes a coil, an outer magnetic assembly, and an inner magnetic assembly. The coil is disposed on the movable part. The outer magnetic assembly is disposed on the first fixed part. The inner magnetic assembly is disposed on the second fixed part, wherein when viewed along the optical axis, the coil is located between the outer and inner magnetic assemblies.

In some embodiments, when a current signal is applied to the coil, the coil and the outer magnetic assembly generate a first electromagnetic force, and the coil and the inner magnetic assembly generate a second electromagnetic force, wherein the first and second electromagnetic forces are in the same direction.

In some embodiments, the first electromagnetic force is greater than the second electromagnetic force.

In some embodiments, the outer magnetic assembly includes a first outer magnet and a second outer magnet, and the inner magnetic assembly includes a first inner magnet and a second inner magnet, wherein the first and second outer magnets and the first and second inner magnets are arranged in a first direction that is perpendicular to the optical axis, and the thickness of the first and second outer magnets in the first direction is greater than the thickness of the first and second inner magnets in the first direction.

In some embodiments, the height of the first and second outer magnets along the optical axis is greater than the height of the first and second inner magnets along the optical axis.

In some embodiments, the outer magnetic assembly further includes a third outer magnet and a fourth outer magnet, and the inner magnetic assembly further includes a third inner magnet and a fourth inner magnet, wherein the third and fourth outer magnets and the third and fourth inner magnets are arranged in a second direction that is perpendicular to the optical axis, and the thickness of the third and fourth outer magnets in the second direction is greater than the thickness of the third and fourth inner magnets in the second direction, wherein the second direction is not parallel to the first direction.

In some embodiments, the height of the third and fourth outer magnets along the optical axis is greater than the height of the third and fourth inner magnets along the optical axis.

In some embodiments, the movable part has a recessed structure, and the second fixed part has a stage extending along the optical axis into the recessed structure.

In some embodiments, the inner magnetic assembly is disposed on the stage.

In some embodiments, the stage has several slots for receiving the inner magnetic assembly.

In some embodiments, the second fixed part further has several stoppers extending along the optical axis from the top surface of the stage, and the top surface faces the surface of the recessed structure, wherein when the movable part moves relative to the second fixed part to a limit position, the stoppers contact the surface to restrict the movable part in the limit position.

In some embodiments, the top surface has a rectangular shape, and the stoppers are located at the corners of the top surface.

In some embodiments, the second fixed part further has a wall and a groove, the wall extends along the optical axis into the recessed structure, and the groove is located between the stage and the wall.

In some embodiments, the wall and the groove have an annular structure, and the groove surrounds the wall.

In some embodiments, the driving mechanism further includes an upper sheet spring, a first lower sheet spring, and a second lower sheet spring. The upper sheet spring has an outer frame and an inner frame, wherein the outer frame is connected to the first fixed part, and the inner frame is connected to the movable part. The first and second lower sheet springs connect the second fixed part with the movable part, wherein the first and second lower sheet springs are located on opposite sides of the stage.

In some embodiments, the coil is electrically connected to an external circuit via the first and second lower sheet springs.

In some embodiments, the first lower sheet spring has a first conductive leg extending along the optical axis, and the second lower sheet spring has a second conductive leg extending along the optical axis, wherein the first and second conductive legs are exposed to a side of the second fixed part and electrically connected to the external circuit.

In some embodiments, the outer frame has a rectangular structure, the inner frame has a circular structure, and the upper sheet spring further has two connecting portions connected to the inner and outer frames, wherein the connecting portions are located close to a central position of a side of the outer frame.

In some embodiments, the driving mechanism further includes a position sensor detecting the movement of the movable part relative to the first and second fixed parts.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The making and using of the embodiments of the driving mechanism are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Unless defined otherwise, all technical and scientific terms used herein have the same meaning as commonly understood by one of ordinary skill in the art to which this invention belongs. It should be appreciated that each term, which is defined in a commonly used dictionary, should be interpreted as having a meaning conforming to the relative skills and the background or the context of the present disclosure, and should not be interpreted in an idealized or overly formal manner unless defined otherwise.

In the following detailed description of the preferred embodiments, reference is made to the accompanying drawings, and in which specific embodiments of which the invention may be practiced are shown by way of illustration. In this regard, directional terminology, such as "top," "bottom." "left." "right." "front," "back," etc., is used with reference to the orientation of the figures being described. The components of the present invention can be positioned in a number of different orientations. As such, the directional terminology is used for the purposes of illustration and is in no way limiting.

Figure 1:
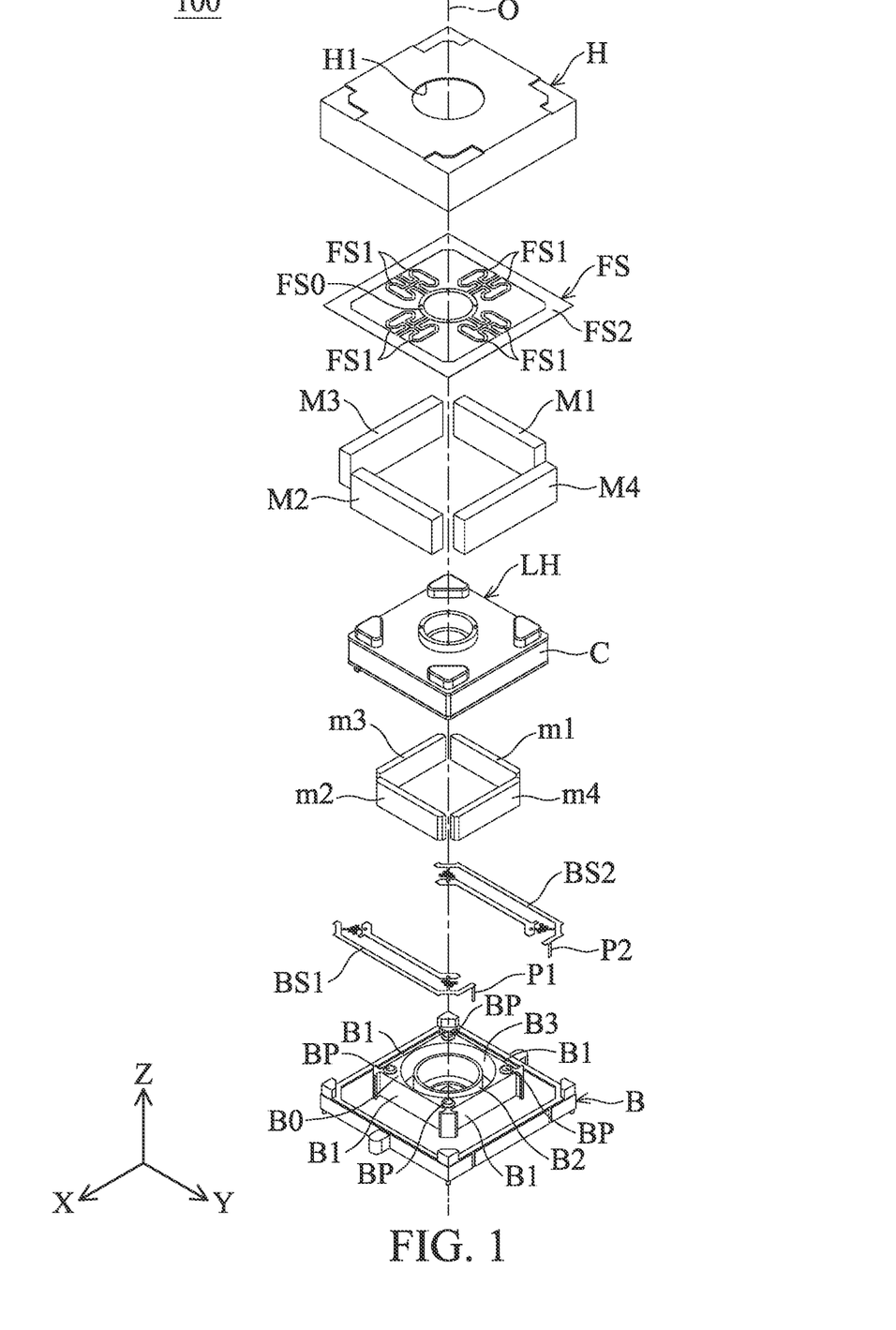
FIG. 1 is an exploded diagram of a driving mechanism 100 in accordance of an embodiment of the invention.
Figure 2:
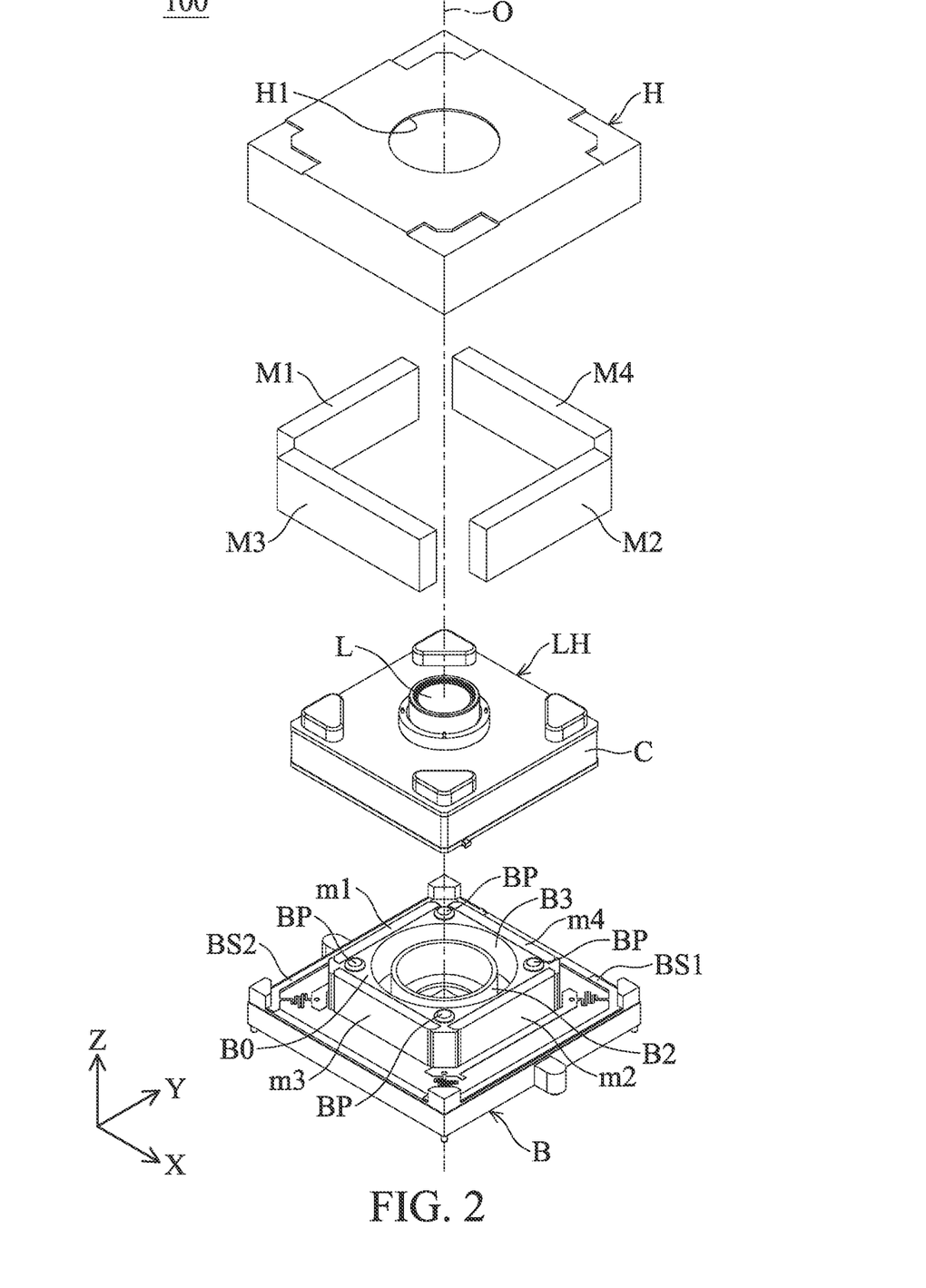
FIGS. 2 and 3 are exploded diagrams of the driving mechanism 100 of FIG. 1 with an optical element L disposed therein.
Figure 3:
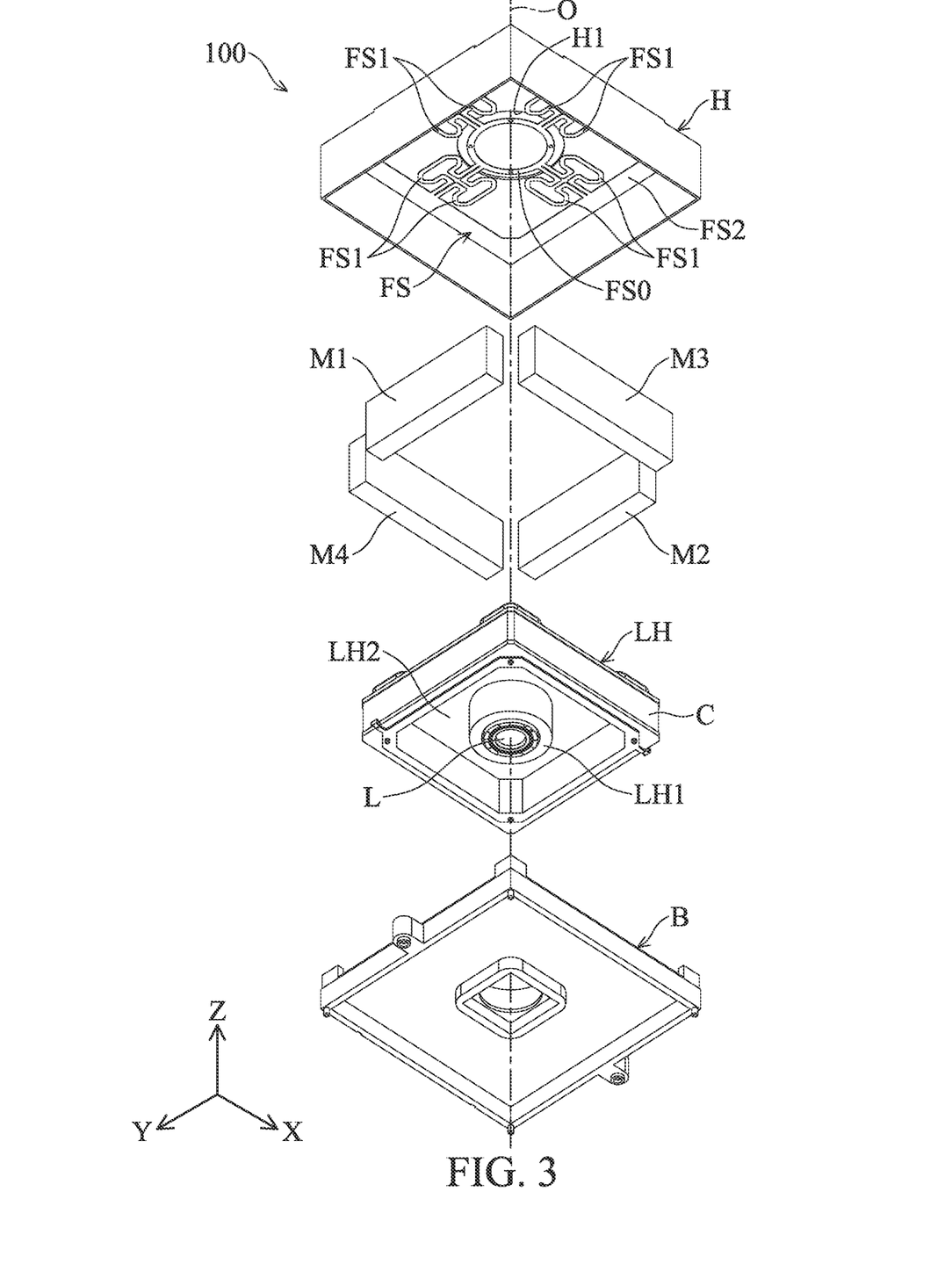
Figure 4:
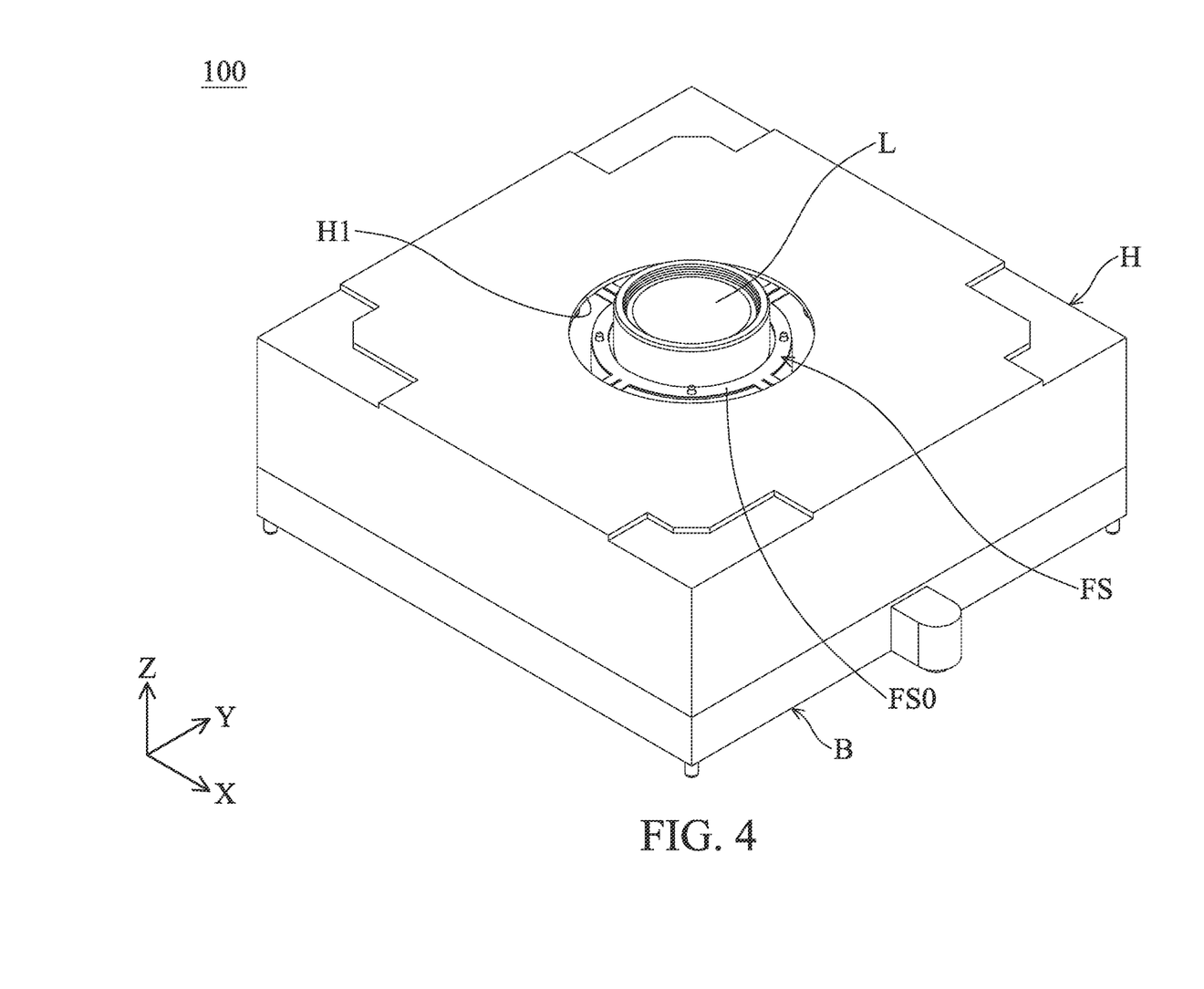
FIG. 4 is a perspective diagram of the optical element L and the driving mechanism 100 after assembly.
Figure 5:
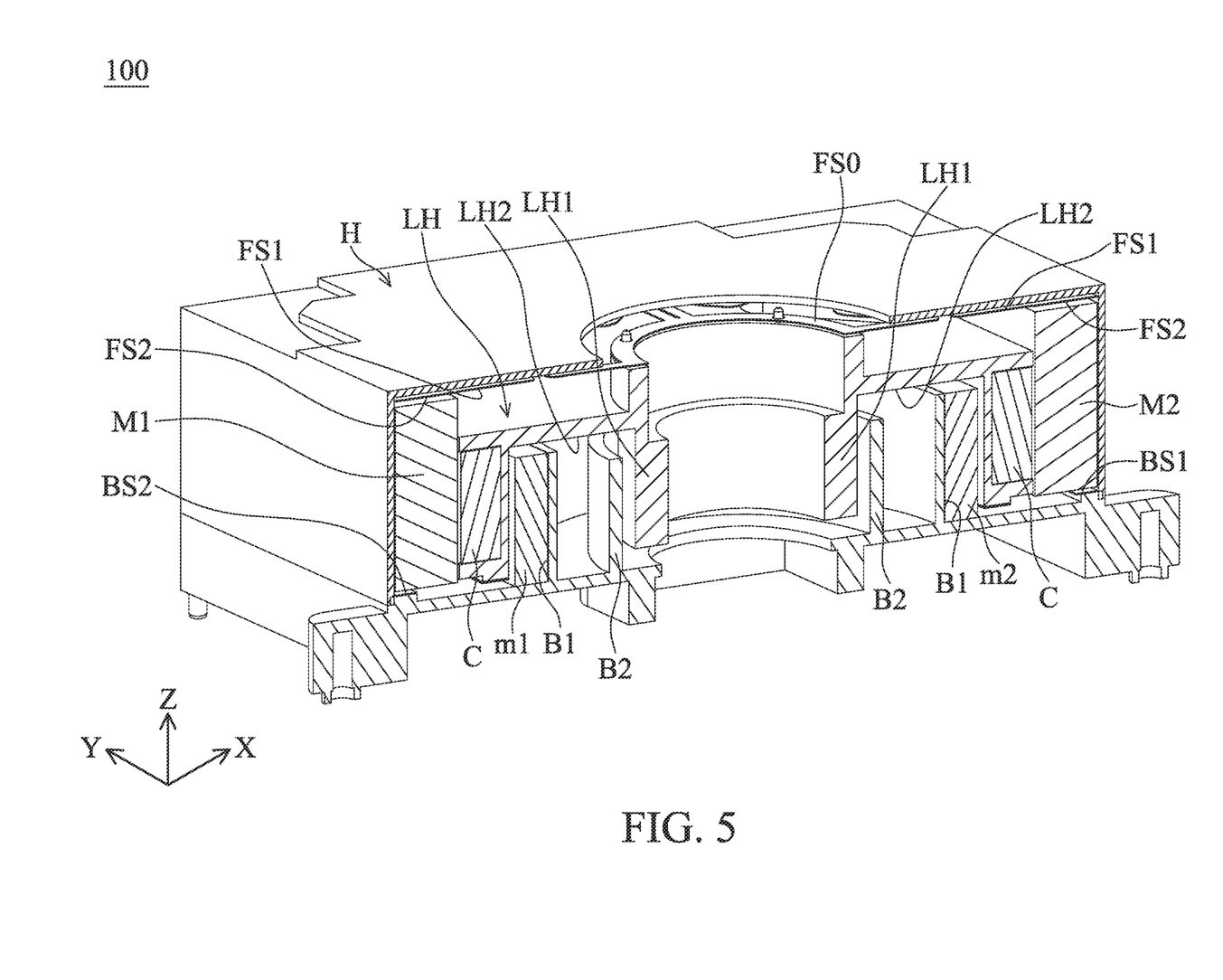
FIG. 5 is across-sectional view of the driving mechanism 100.
Figure 6:
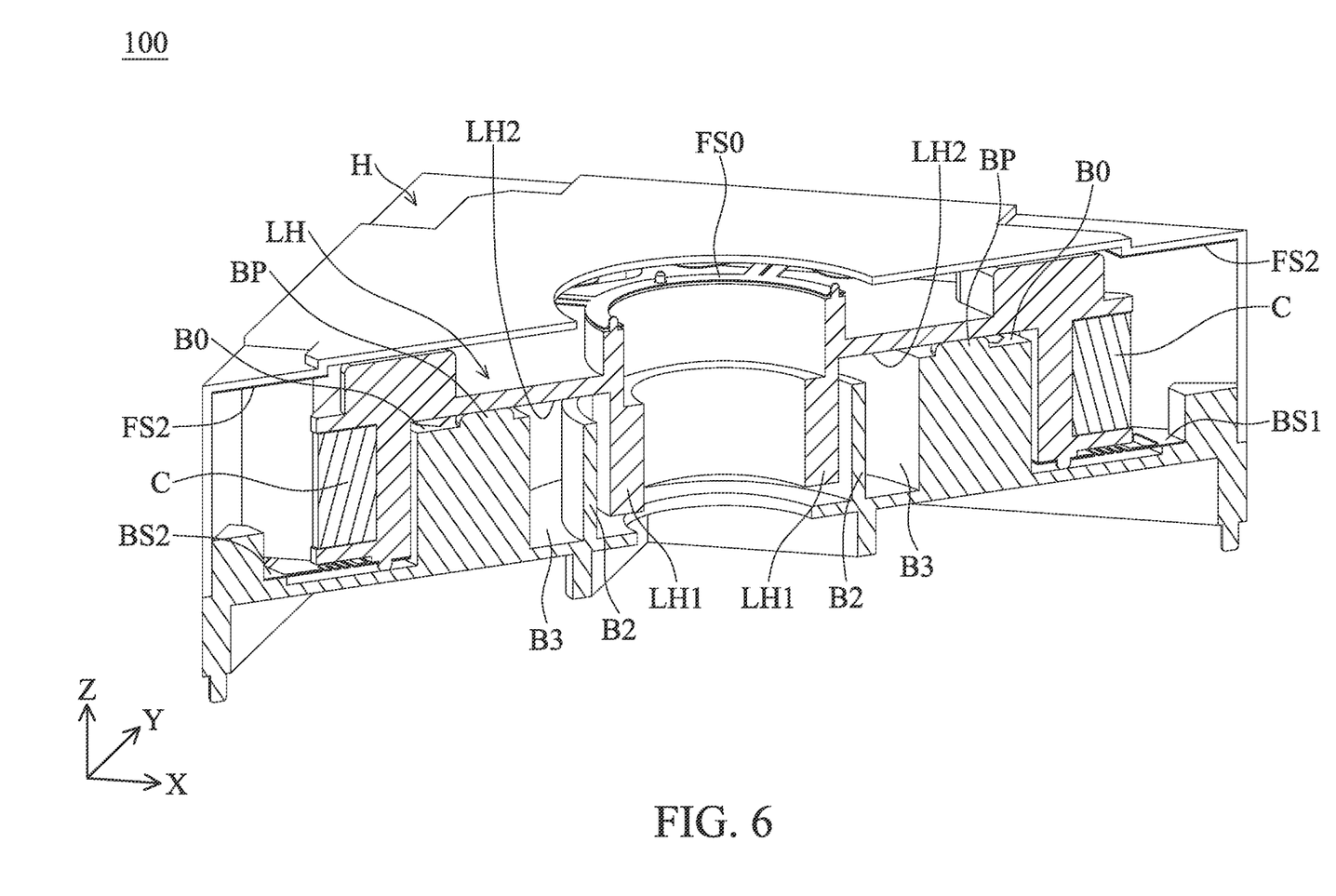
FIG. 6 is another cross-sectional view of the driving mechanism 100.
Figure 7:
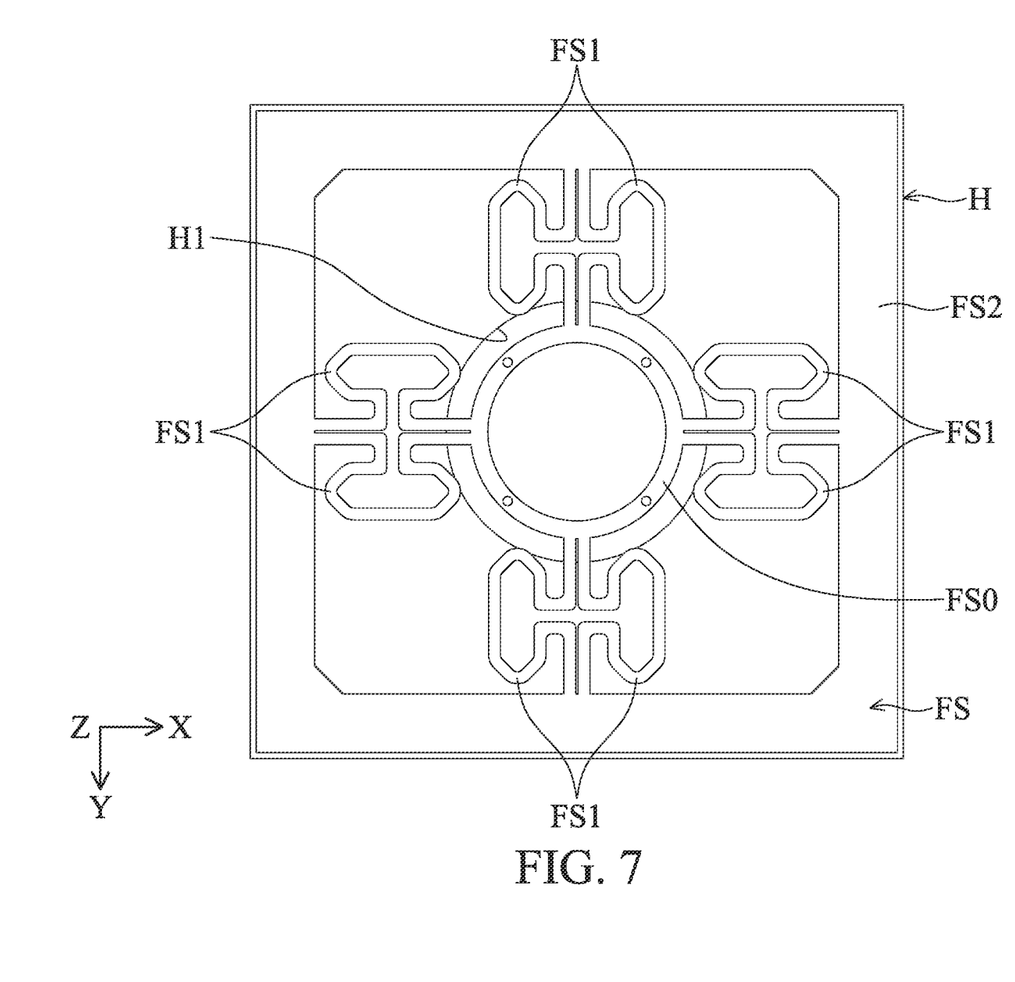
FIG. 7 is a bottom view of the housing H and the upper sheet spring FS connected to the housing H.

FIG. 1 is an exploded diagram of a driving mechanism 100 in accordance of an embodiment of the invention. FIGS. 2 and 3 are exploded diagrams of the driving mechanism 100 of FIG. 1 with an optical element L disposed therein, FIG. 4 is a perspective diagram of the optical element L and the driving mechanism 100 after assembly, FIG. 5 is across-sectional view of the driving mechanism 100. FIG. 6 is another cross-sectional view of the driving mechanism 100, and FIG. 7 is a bottom view of the housing H and the upper sheet spring FS connected to the housing H.

Referring to FIGS. 1-7, the driving mechanism 100 may be a voice coil motor (VCM) for driving an optical element (e.g. optical lens) to move along the Z axis. In this embodiment, the driving mechanism 100 primarily includes a housing H (first fixed part), a base B (second fixed part), a holder LH (movable part) for holding an optical element L, an upper sheet spring FS, a first lower sheet spring BS1, a second lower sheet spring BS2, an outer magnetic assembly, and an inner magnetic assembly.

The upper sheet spring FS has a flat structure that includes an inner frame FS0, several connecting portions FS1, and an outer frame FS2. The outer frame FS2 is affixed to an inner surface of the housing H, the inner frame FS0 is affixed to the holder LH, and the connecting portions FS1 connect the inner frame FS0 with the outer frame FS2. The outer frame FS2 has a rectangular structure, the inner frame FS0 has a circular structure and exposed to an opening H1 of the housing H. Specifically, each pair of the connecting portions FS1 are arranged side by side and close to a central position of a side of the rectangular outer frame FS2.

Additionally, the first lower sheet spring BS1 and the second lower sheet spring BS2 are disposed on opposite sides of a stage B0 of the base B and movably connect the base B with the holder LH. In this embodiment, the outer magnetic assembly is affixed to an inner surface of the housing H and includes a first outer magnet M1, a second outer magnet M2, a third outer magnet M3, and a fourth outer magnet M4. The inner magnetic assembly is affixed to the base B and includes a first inner magnet m1, a second inner magnet m2, a third inner magnet m3, and a fourth inner magnet m4.

A coil C is disposed on the holder H, wherein the coil C and the outer and inner magnetic assemblies constitute a driving unit that can produce an electromagnetic force for moving the holder LH and the optical element L therein relative to the housing H and the base B along an optical axis O (Z direction) of the optical element L.

The coil C is electrically connected to an external circuit via the first and second lower sheet springs BS1 and BS2. The first lower sheet spring BS1 has a first conductive leg P1 extending along the optical axis O, and the second lower sheet spring BS2 has a second conductive leg P2 extending along the optical axis O. The first and second conductive legs P1 and P2 are exposed to a side of the base B and electrically connected to the external circuit.

In some embodiments, a position sensor (not shown) may be disposed on the base B to detect the movement of the holder LH relative to the housing H and the base B. For example, the position sensor may comprise Hall sensor, Magnetoresistance (MR) effect sensor, Giant Magnetoresistance (GMR), Tunneling Magnetoresistance (TMR) effect sensor, optical encoder or infrared sensor.

In FIGS. 1, 2, 5, and 6, the base B has a rectangular stage B0 extending along the optical axis O from the center thereof. Four slots B1 are respectively formed on the four sides of the stage B0 for receiving the first, second, third, and fourth inner magnetic elements m1~m4.

Additionally, four stoppers BP are formed on the top surface of the stage B0 and extend upwardly along the optical axis O. The top surface of the stage B0 has a substantially rectangular shape, and the four stoppers BP are located at the four corners of the top surface of the stage B0.

Moreover, as shown in FIGS. 3, 5, and 6, the bottom of the holder LH has a hollow barrel portion LH1 and a recessed structure LH2. The optical element L (e.g. optical lens) is received in the barrel portion LH1, and the barrel portion LH1 is surrounded by the recessed structure LH2.

After assembly of the driving mechanism 100, the stage B0 of the base B is inserted into the recessed structure LH2, and the top surface of the stage B0 faces a surface of the recessed structure LH2. When the holder LH is driven by an electromagnetic force and moves upwardly relative the base B to a limit position along the Z axis, the stoppers BP on the top surface of the stage B0 contact the surface of the recessed structure LH2. Therefore, the holder LH can be restricted in the limit position to prevent collision between the holder LH and the edges of the base B.

Moreover, as shown in FIGS. 1, 2, 5, and 6, the base B further has a wall B2 and a groove B3. The wall B2 and the groove B3 have an annular structure, and the groove B3 surrounds the wall B2. After assembly of the driving mechanism 100, the wall B2 is inserted into the recessed structure H2 along the optical axis O (FIGS. 5 and 6), whereby dust or particles can be prevented from falling onto an image sensor (not shown) below the base B through the hole at the center of the base B.

Figure 8:
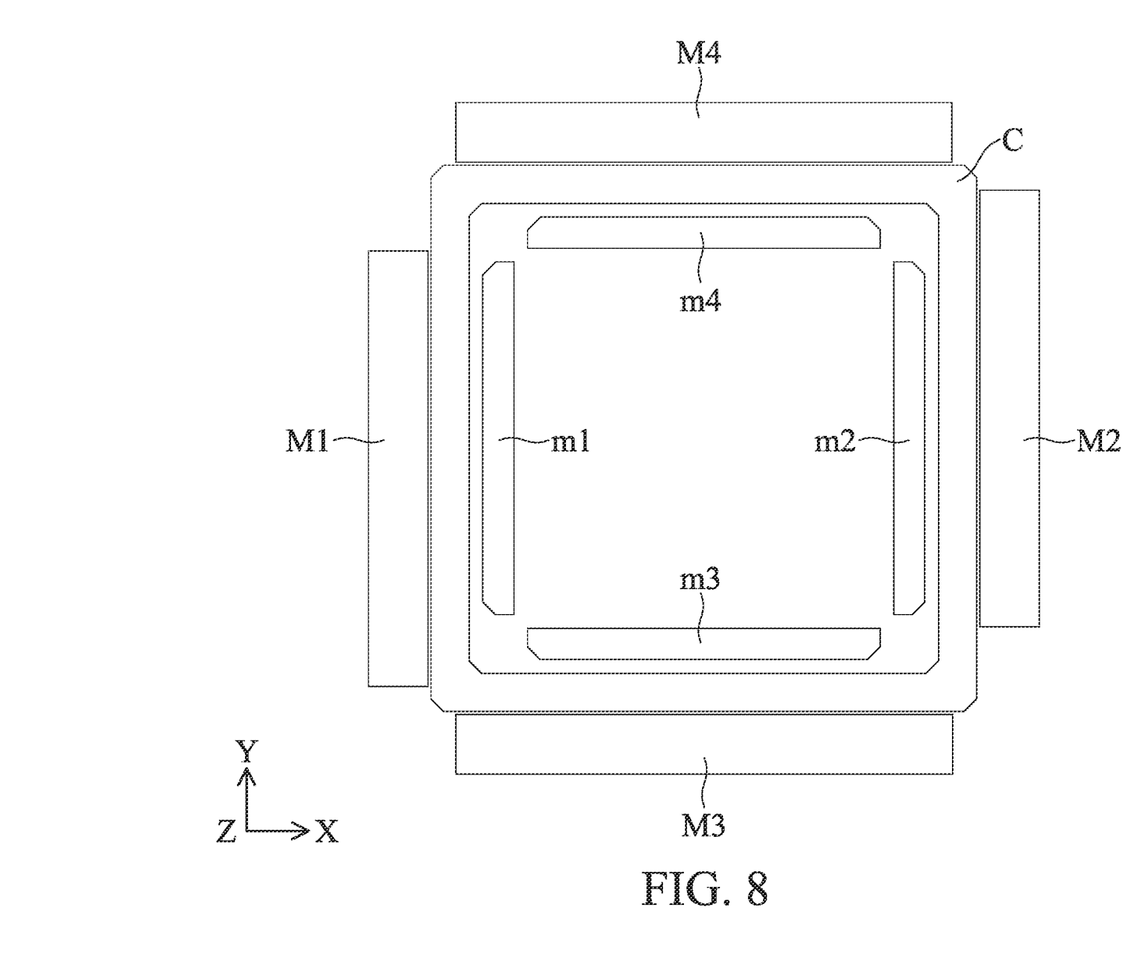
FIG. 8 is a top view of the outer magnetic assembly, the inner magnetic assembly, and the coil C.
Figure 9:
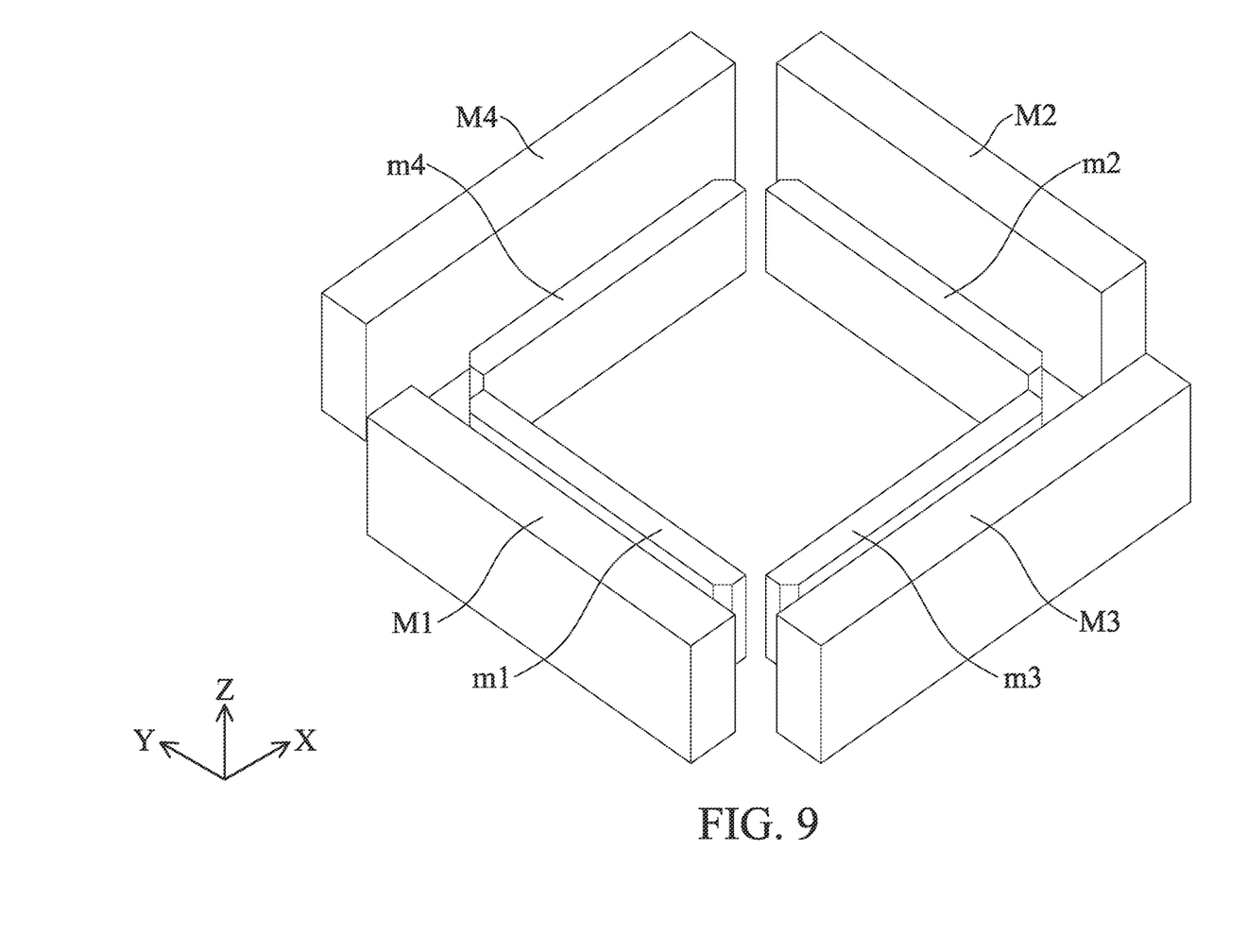
FIG. 9 is a perspective diagram that shows relative position of the outer magnetic assembly and the inner magnetic assembly.

FIG. 8 is a top view of the outer magnetic assembly, the inner magnetic assembly, and the coil C. FIG. 9 is a perspective diagram that shows relative position of the outer magnetic assembly and the inner magnetic assembly.

Referring to FIGS. 5, 8, and 9, after assembly of the driving mechanism 100, the coil C is located between the outer magnetic assembly (the first, second, third, and fourth outer magnetic elements M1~M4) and the inner magnetic assembly (the first, second, third, and fourth inner magnetic elements m1~m4) when viewed along the optical axis O (Z direction), wherein the coil C and the outer and inner outer magnetic assemblies do not overlap.

It should be noted that when a current signal is applied to the coil C, the coil C and the outer magnetic assembly (the first, second, third, and fourth outer magnetic elements M1~M4) can generate a first electromagnetic force, and the coil C and the inner magnetic assembly (the first, second, third, and fourth inner magnetic elements m1~m4) can generate a second electromagnetic force, wherein the first and second electromagnetic forces are in the same direction, and the first electromagnetic force is greater than the second electromagnetic force, thereby increasing the driving power and efficiency of the driving mechanism 100.

In this embodiment, the first and second outer magnets M1 and M2 and the first and second inner magnets m1 and m2 are arranged in a first direction (X direction) that is perpendicular to the optical axis O (Z direction), and the third and fourth outer magnets M3 and M4 and the third and fourth inner magnets m3 and m4 are arranged in a second direction (Y direction) that is perpendicular to the optical axis O (Z direction), wherein the second direction is not parallel to the first direction.

As shown in FIGS. 8 and 9, the thickness of the first and second outer magnetic elements M1 and M2 in the first direction (X direction) is greater than the thickness of the first and second inner magnetic elements m1 and m2 in the first direction (X direction), and the thickness of the third and fourth outer magnets M3 and M4 in the second direction (Y direction) is greater than the thickness of the third and fourth inner magnets m3 and m4 in the second direction (Y direction).

Moreover, the height of the first, second, third, and fourth outer magnetic elements M1~M4 along the optical axis O (Z direction) is greater than the height of the first, second, third, and fourth inner magnetic elements m1~m4 along the optical axis O (Z direction).

Hence, the first electromagnetic force generated by the coil C and the outer magnetic assembly (the first, second, third, and fourth outer magnetic elements M1~M4) can be greater than the second electromagnetic force generated by the coil C and the inner magnetic assembly (the first, second, third, and fourth inner magnetic elements m1~m4), thereby increasing the driving power and efficiency of the driving mechanism 100.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, compositions of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. Moreover, the scope of the appended claims should be accorded the broadest interpretation so as to encompass all such modifications and similar arrangements.

While the invention has been described by way of example and in terms of preferred embodiment, it should be understood that the invention is not limited thereto. On the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A Voice Coil Motor (VCM) for moving an optical element, comprising:
   a first fixed part,
   a second fixed part, connected to the first fixed part;
   a movable part, movably connected to the first and second fixed parts for holding the optical element, wherein the optical element has an optical axis; and
   a driving unit, driving the movable part to move along the optical axis relative to the first and second fixed parts, wherein the driving unit comprises a coil disposed on the movable part, an outer magnetic assembly disposed on the first fixed part, and an inner magnetic assembly disposed on the second fixed part, wherein when viewed along the optical axis, the coil is located between the outer and inner magnetic assemblies.

2. The Voice Coil Motor (VCM) as claimed in claim 1, wherein when a current signal is applied to the coil, the coil and the outer magnetic assembly generate a first electromagnetic force, and the coil and the inner magnetic assembly generate a second electromagnetic force, wherein the first and second electromagnetic forces are in the same direction.

3. The Voice Coil Motor (VCM) as claimed in claim 2, wherein the first electromagnetic force is greater than the second electromagnetic force.

4. The Voice Coil Motor (VCM) as claimed in claim 2, wherein the outer magnetic assembly includes a first outer magnet and a second outer magnet, and the inner magnetic assembly includes a first inner magnet and a second inner magnet, wherein the first and second outer magnets and the first and second inner magnets are arranged in a first direction that is perpendicular to the optical axis, and the thickness of the first and second outer magnets in the first direction is greater than the thickness of the first and second inner magnets in the first direction.

5. The Voice Coil Motor (VCM) as claimed in claim 4, wherein the height of the first and second outer magnets along the optical axis is greater than the height of the first and second inner magnets along the optical axis.

6. The Voice Coil Motor (VCM) as claimed in claim 4, wherein the outer magnetic assembly further includes a third outer magnet and a fourth outer magnet, and the inner magnetic assembly further includes a third inner magnet and a fourth inner magnet, wherein the third and fourth outer magnets and the third and fourth inner magnets are arranged in a second direction that is perpendicular to the optical axis, and the thickness of the third and fourth outer magnets in the second direction is greater than the thickness of the third and fourth inner magnets in the second direction, wherein the second direction is not parallel to the first direction.

7. The Voice Coil Motor (VCM) as claimed in claim 6, wherein the height of the third and fourth outer magnets along the optical axis is greater than the height of the third and fourth inner magnets along the optical axis.

8. The Voice Coil Motor (VCM) as claimed in claim 1, wherein the movable part has a recessed structure, and the second fixed part has a stage extending along the optical axis into the recessed structure.

9. The Voice Coil Motor (VCM) as claimed in claim 8, wherein the inner magnetic assembly is disposed on the stage.

10. The Voice Coil Motor (VCM) as claimed in claim 9, wherein the stage has several slots for receiving the inner magnetic assembly.

11. The Voice Coil Motor (VCM) as claimed in claim 8, wherein the second fixed part further has several stoppers extending along the optical axis from a top surface of the stage, and the top surface faces a surface of the recessed structure, wherein when the movable part moves relative to the second fixed part to a limit position, the stoppers contact the surface to restrict the movable part in the limit position.

12. The Voice Coil Motor (VCM) as claimed in claim 8, wherein the top surface has a rectangular shape, and the stoppers are located at the corners of the top surface.

13. The Voice Coil Motor (VCM) as claimed in claim 12, wherein the second fixed part further has a wall and a groove, the wall extends along the optical axis into the recessed structure, and the groove is located between the stage and the wall.

14. The Voice Coil Motor (VCM) as claimed in claim 13, wherein the wall and the groove have an annular structure, and the groove surrounds the wall.

15. The Voice Coil Motor (VCM) as claimed in claim 8, further comprising:
an upper sheet spring, having an outer frame and an inner frame, wherein the outer frame is connected to the first fixed part, and the inner frame is connected to the movable part;
a first lower sheet spring, connecting the second fixed part with the movable part; and
a second lower sheet spring, connecting the second fixed part with the movable part, wherein the first and second lower sheet springs are located on opposite sides of the stage.

16. The Voice Coil Motor (VCM) as claimed in claim 15, wherein the coil is electrically connected to an external circuit via the first and second lower sheet springs.

17. The Voice Coil Motor (VCM) as claimed in claim 16, wherein the first lower sheet spring has a first conductive leg extending along the optical axis, and the second lower sheet spring has a second conductive leg extending along the optical axis, wherein the first and second conductive legs are exposed to a side of the second fixed part and electrically connected to the external circuit.

18. The Voice Coil Motor (VCM) as claimed in claim 15, wherein the outer frame has a rectangular structure, the inner frame has a circular structure, and the upper sheet spring further has two connecting portions connected to the inner and outer frames, wherein the connecting portions are located close to a central position of a side of the outer frame.

19. The Voice Coil Motor (VCM) as claimed in claim 1, further comprising a position sensor detecting the movement of the movable part relative to the first and second fixed parts.

* * * * *